US012772846B2

(12) United States Patent
Yang

(10) Patent No.: US 12,772,846 B2
(45) Date of Patent: Oct. 20, 2026

(54) MCM PACKAGE STRUCTURE HAVING EMBEDDED DIE AND MANUFACTURING METHOD THEREFOR

(71) Applicant: CR Runan Technologies (Chongqing) Co. Ltd., Chongqing (CN)

(72) Inventor: Weiyuan Yang, Chongqing (CN)

(73) Assignee: CR RUNAN TECHNOLOGIES (CHONGQING) CO. LTD., Chongqing (CN)

( * ) Notice: Subject to any disclaimer, the term of this patent is extended or adjusted under 35 U.S.C. 154(b) by 433 days.

(21) Appl. No.: 18/567,151

(22) PCT Filed: Apr. 28, 2022

(86) PCT No.: PCT/CN2022/089779
§ 371 (c)(1),
(2) Date: Dec. 5, 2023

(87) PCT Pub. No.: WO2023/005307
PCT Pub. Date: Feb. 2, 2023

(65) Prior Publication Data
US 2024/0274501 A1 Aug. 15, 2024

(30) Foreign Application Priority Data
Jul. 29, 2021 (CN) ......................... 202110864854.4

(51) Int. Cl.
*H10W 40/25* (2026.01)
*H10W 10/00* (2026.01)
(Continued)

(52) U.S. Cl.
CPC ....... *H10W 40/258* (2026.01); *H10W 10/014* (2026.01); *H10W 10/17* (2026.01);
(Continued)

(58) Field of Classification Search
CPC . H10W 40/258; H10W 10/014; H10W 10/17; H10W 74/114; H10W 74/00;
(Continued)

(56) References Cited

U.S. PATENT DOCUMENTS 6,265,769 B1 7/2001 Liang et al.
10,535,588 B2 1/2020 Rodriguez et al.
(Continued)

FOREIGN PATENT DOCUMENTS

CN 102117799 A * 7/2011 ........... H10D 62/117
CN 103168358 A 6/2013
(Continued)

OTHER PUBLICATIONS

ISA State Intellectual Property Office of the People's Republic of China, International Search Report Issued in Application No. PCT/CN2022/089779, Jul. 19, 2022, WIPO, 4 pages.
(Continued)

*Primary Examiner* — Eric W Jones
(74) *Attorney, Agent, or Firm* — Carroll, Hoette & Butscher, LLC; Christopher R. Carroll

(57) ABSTRACT

The present disclosure provides an MCM package structure and manufacturing methods therefor. In the MCM package structure, a first die, a second die, and an electric connection structure are encapsulated in a plastic encapsulation layer, where the first die is provided with an accommodating recess, and an opening of the accommodating recess is located on a back surface of the first die; the second die is arranged in the accommodating recess and fixed with the first die through a thermal conductive adhesive, and an active surface of the second die faces away from an active surface of the first die; a heat dissipation electrode is disposed on a side of a front surface of the plastic encap-
(Continued)

sulation layer, and the heat dissipation electrode is connected to the thermal conductive adhesive.

17 Claims, 11 Drawing Sheets

(51) Int. Cl.

| | |
|---|---|
| ***H10W 10/17*** | (2026.01) |
| ***H10W 70/60*** | (2026.01) |
| ***H10W 72/30*** | (2026.01) |
| ***H10W 72/90*** | (2026.01) |
| ***H10W 74/00*** | (2026.01) |
| ***H10W 74/10*** | (2026.01) |
| ***H10W 90/00*** | (2026.01) |
| ***H10W 90/20*** | (2026.01) |

(52) U.S. Cl.
CPC ........ *H10W 70/614* (2026.01); *H10W 74/114* (2026.01); *H10W 90/00* (2026.01); *H10W 72/321* (2026.01); *H10W 72/344* (2026.01); *H10W 72/921* (2026.01); *H10W 72/923* (2026.01); *H10W 72/9415* (2026.01); *H10W 74/00* (2026.01); *H10W 90/20* (2026.01)

(58) Field of Classification Search
CPC ... H10W 90/00; H10W 90/20; H10W 70/614; H10W 72/321; H10W 72/923; H10W 72/344; H10W 72/9415; H10W 72/921
USPC .......................................................... 257/712
See application file for complete search history.

(56) References Cited

U.S. PATENT DOCUMENTS

| | | | | |
|---|---|---|---|---|
| 10,559,525 | B2 * | 2/2020 | Yu | H10W 70/09 |
| 2008/0067634 | A1 | 3/2008 | Swee Seng | |
| 2008/0116564 | A1 * | 5/2008 | Yang | H10W 70/093 257/E21.505 |
| 2014/0118951 | A1 * | 5/2014 | Hsu | H05K 1/0206 361/717 |
| 2015/0318262 | A1 * | 11/2015 | Gu | H10W 74/019 257/737 |
| 2016/0122604 | A1 * | 5/2016 | Yoshimoto | C08G 59/32 252/74 |
| 2018/0204786 | A1 | 7/2018 | Rodriguez et al. | |
| 2020/0111680 | A1 * | 4/2020 | Fillion | H10W 70/05 |
| 2020/0203187 | A1 * | 6/2020 | Chew | H10W 74/01 |
| 2020/0328170 | A1 * | 10/2020 | Paek | H10W 70/093 |

FOREIGN PATENT DOCUMENTS

| | | | |
|---|---|---|---|
| CN | 207320100 | U | 5/2018 |
| CN | 210429782 | U | 4/2020 |
| CN | 111952255 | A | 11/2020 |
| CN | 112151466 | A | 12/2020 |
| CN | 112908979 | A | 6/2021 |
| CN | 113611692 | A | 11/2021 |

OTHER PUBLICATIONS

ISA State Intellectual Property Office of the People's Republic of China, Written Opinion of the International Searching Authority Issued in Application No. PCT/CN2022/089779, Jul. 19, 2022, WIPO, 4 pages.

* cited by examiner

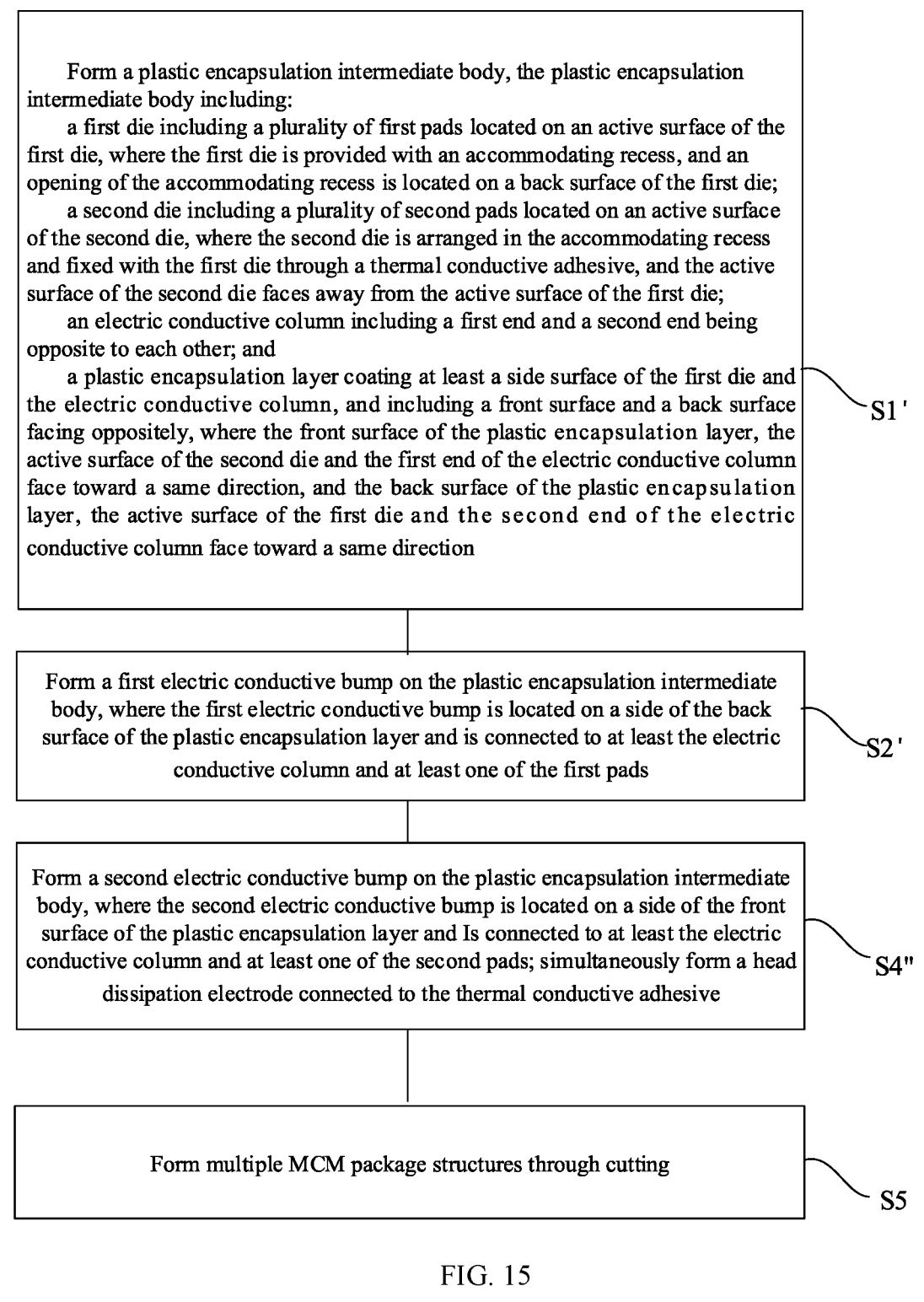

Form a plastic encapsulation intermediate body, the plastic encapsulation intermediate body including:

a first die including a plurality of first pads located on an active surface of the first die, where the first die is provided with an accommodating recess, and an opening of the accommodating recess is located on a back surface of the first die;

a second die including a plurality of second pads located on an active surface of the second die, where the second die is arranged in the accommodating recess and fixed with the first die through a thermal conductive adhesive, and the active surface of the second die faces away from the active surface of the first die;

an electric conductive column including a first end and a second end being opposite to each other; and a plastic encapsulation layer coating at least a side surface of the first die and the electric conductive column, and including a front surface and a back surface facing oppositely, where the front surface of the plastic encapsulation layer, the active surface of the second die and the first end of the electric conductive column face toward a same direction, and the back surface of the plastic encapsulation layer, the active surface of the first die and the second end of the electric conductive column face toward a same direction

S1'

Form a first electric conductive bump on the plastic encapsulation intermediate body, where the first electric conductive bump is located on a side of the back surface of the plastic encapsulation layer and is connected to at least the electric conductive column and at least one of the first pads

S2'

Form a second electric conductive bump on the plastic encapsulation intermediate body, where the second electric conductive bump is located on a side of the front surface of the plastic encapsulation layer and Is connected to at least the electric conductive column and at least one of the second pads; simultaneously form a head dissipation electrode connected to the thermal conductive adhesive

S4"

Form multiple MCM package structures through cutting

S5

FIG. 15

MCM PACKAGE STRUCTURE HAVING EMBEDDED DIE AND MANUFACTURING METHOD THEREFOR

CROSS-REFERENCE TO RELATED APPLICATIONS

This application is a national stage of International Application No. PCT/CN2022/089779, filed on Apr. 28, 2022, which claims priority to Chinese Patent Application No. 202110864854.4, filed on Jul. 29, 2021, which are hereby incorporated by reference in their entirety.

TECHNICAL FIELD

The present disclosure relates to the field of chip package technology, and in particular, to an MCM package structure and a manufacturing method therefor.

BACKGROUND

During package, dies having different functions are often encapsulated in one package structure to form specific functions, known as Multi-Chip Module (MCM), which has advantages such as small volume, high reliability, high performance and versatility.

In recent years, with the continuous development of circuit integration technology, electronic products are increasingly developing toward miniaturization, intelligence, high integration, high performance, and high reliability. Package technology not only affects the performance of products, but also restricts the miniaturization thereof.

After a product is miniaturized, heat dissipation performance becomes crucial for the product.

In view of this, the present disclosure provides an MCM package structure and a manufacturing method therefor to meet the requirements of small volume, compact structure, high integration, and good heat dissipation performance for the package structure.

SUMMARY

An object of the present disclosure is to provide an MCM package structure and a manufacturing method therefor to meet the requirements of small volume, compact structure, high integration, and good heat dissipation performance for the package structure.

To achieve the object, in a first aspect of the present disclosure, an MCM package structure is provided, including:

- a first die, including first pads located on an active surface of the first die, where the first die is provided with an accommodating recess, and an opening of the accommodating recess is located on a back surface of the first die;
- a second die, including second pads located on an active surface of the second die, where the second die is arranged in the accommodating recess and fixed with the first die through a thermal conductive adhesive, and the active surface of the second die faces away from the active surface of the first die;
- a plastic encapsulation layer, coating at least a side surface of the first die and including a front surface and a back surface facing oppositely, where the front surface of the plastic encapsulation layer and the active surface of the second die face toward a same direction, and the back surface of the plastic encapsulation layer and the active surface of the first die face toward a same direction;
- an electric connection structure, penetrating between the front surface of the plastic encapsulation layer and the back surface of the plastic encapsulation layer;
- a first electric conductive structure, located on a side of the back surface of the plastic encapsulation layer and connected to at least the electric connection structure and at least one of the first pads;
- a second electric conductive structure, located on a side of the front surface of the plastic encapsulation layer and connected to at least the electric connection structure and at least one of the second pads;
- a heat dissipation electrode, located on the side of the front surface of the plastic encapsulation layer and connected to the thermal conductive adhesive.

In a second aspect of the present disclosure, a method for manufacturing an MCM package structure is provided, including:

- forming a plastic encapsulation intermediate body, where the plastic encapsulation intermediate body includes:
  - a first die including first pads located on an active surface of the first die, where the first die is provided with an accommodating recess, and an opening of the accommodating recess is located on a back surface of the first die;
  - a second die including second pads located on an active surface of the second die, where the second die is arranged in the accommodating recess and fixed with the first die through a thermal conductive adhesive, and the active surface of the second die faces away from the active surface of the first die;
  - a plastic encapsulation layer coating at least a side surface of the first die and including a front surface and a back surface facing oppositely, where the front surface of the plastic encapsulation layer and the active surface of the second die face toward a same direction, and the back surface of the plastic encapsulation layer and the active surface of the first die face toward a same direction;
- forming one of a first electric conductive structure and a second electric conductive structure on the plastic encapsulation intermediate body, where the first electric conductive structure is located on a side of the back surface of the plastic encapsulation layer and connected to the first pads: the second electric conductive structure is located on a side of the front surface of the plastic encapsulation layer and connected to the second pads: forming a heat dissipation electrode while the second electric conductive structure is formed, and the heat dissipation electrode is connected to the thermal conductive adhesive;
- forming a through hole in the plastic encapsulation layer, where a bottom wall of the through hole exposes the formed first electric conductive structure or second electric conductive structure;
- forming another one of the first electric conductive structure and the second electric conductive structure on the plastic encapsulation intermediate body, and simultaneously forming an electric conductive layer on side walls and the bottom wall of the through hole and the plastic encapsulation layer outside the through hole, where the another one of the first electric conductive structure and the second electric conductive structure is connected to the electric conductive layer located on the plastic encapsulation layer outside the through hole.

In a third aspect of the present disclosure, another method for manufacturing an MCM package structure is provided, including:

forming a plastic encapsulation intermediate body, where the plastic encapsulation intermediate body includes:

a first die including first pads located on an active surface of the first die, where the first die is provided with an accommodating recess, and an opening of the accommodating recess is located on a back surface of the first die;

a second die including second pads located on an active surface of the second die, where the second die is arranged in the accommodating recess and fixed with the first die through a thermal conductive adhesive, and the active surface of the second die faces away from the active surface of the first die;

a plastic encapsulation layer coating at least a side surface of the first die and including a front surface and a back surface facing oppositely, where the front surface of the plastic encapsulation layer and the active surface of the second die face toward a same direction, and the back surface of the plastic encapsulation layer and the active surface of the first die face toward a same direction;

forming one of a first electric conductive structure and a second electric conductive structure on the plastic encapsulation intermediate body, where the first electric conductive structure is located on a side of the back surface of the plastic encapsulation layer and connected to the first pads: the second electric conductive structure is located on a side of the front surface of the plastic encapsulation layer and connected to the second pads: forming a heat dissipation electrode while the second electric conductive structure is formed, and the heat dissipation electrode is connected to the thermal conductive adhesive;

forming an electric conductive plug in the plastic encapsulation layer, where the electric conductive plug includes a first end and a second end being opposite to each other, and the first end is connected to the formed first electric conductive structure or second electric conductive structure;

forming another one of the first electric conductive structure and the second electric conductive structure on the plastic encapsulation intermediate body and the second end of the electric conductive plug.

In a fourth aspect of the present disclosure, another method for manufacturing an MCM package structure is provided, including:

forming a plastic encapsulation intermediate body, where the plastic encapsulation intermediate body includes:

a first die including first pads located on an active surface of the first die, where the first die is provided with an accommodating recess, and an opening of the accommodating recess is located on a back surface of the first die;

a second die including second pads located on an active surface of the second die, where the second die is arranged in the accommodating recess and fixed with the first die through a thermal conductive adhesive, and the active surface of the second die faces away from the active surface of the first die;

an electric conductive column including a first end and a second end being opposite to each other;

a plastic encapsulation layer coating at least a side surface of the first die and the electric conductive column, and including a front surface and a back surface facing oppositely, where the front surface of the plastic encapsulation layer, the active surface of the second die and the first end of the electric conductive column face toward a same direction, and the back surface of the plastic encapsulation layer, the active surface of the first die and the second end of the electric conductive column face toward a same direction;

forming one of a first electric conductive structure and a second electric conductive structure on the plastic encapsulation intermediate body, where the first electric conductive structure is located on a side of the back surface of the plastic encapsulation layer and connected to at least the electric conductive column and at least one of the first pads: the second electric conductive structure is located on a side of the front surface of the plastic encapsulation layer and connected to at least the electric conductive column and at least one of the second pads; forming a heat dissipation electrode while the second electric conductive structure is formed, and the heat dissipation electrode is connected to the thermal conductive adhesive;

forming another one of the first electric conductive structure and the second electric conductive structure on the plastic encapsulation intermediate body;

forming the MCM package structure through cutting.

During the research, inventors found that: the MCM package structure may be implemented in two ways: stacking multiple dies in the package structure and stacking multiple chip package structures in the package structure.

Stacking the multiple dies in the package structure refers to: flipping the dies on their corresponding substrates first, where both sides of each substrate are provided with interconnection solder joints, and then stacking the multiple substrates through the interconnection solder joints for electrical interconnection.

Stacking the multiple chip package structures in the package structure refers to: overlapping small-scale package bodies with the same type and similar size, and using end arrangement of original standard package bodies to braze the same terminals of the overlapped small-scale package bodies together for achieving the electrical connection between respective package bodies.

However, on one hand, the size of the MCM package structure is relatively large and the package process thereof is cumbersome. On the other hand, the heat dissipation of the package structure is achieved through a heat dissipation electrode electrically connected to pads, and the heat dissipation effect is limited.

Unlike the above two package ways, in the MCM package structure of the present disclosure, the first die and the second die are encapsulated in the plastic encapsulation layer, where the first die includes first pads located on the active surface of the first die, the first die is provided with the accommodating recess, and the opening of the accommodating recess is located on the back surface of the first die: the second die includes second pads located on the active surface of the second die, the second die is arranged in the accommodating recess and fixed with the first die through the thermal conductive adhesive, and the active surface of the second die faces away from the active surface of the first die: the electric connection structure penetrates between the front surface of the plastic encapsulation layer and the back surface of the plastic encapsulation layer: the first electric conductive structure is provided on a side of the back surface of the plastic encapsulation layer and connected to at least the electric connection structure and at least one of the first pads: the second electric conductive structure and the heat dissipation electrode are provided on a side of the front surface of the plastic encapsulation layer, and the second electric conductive structure is connected to at least the electric connection structure and at least one of the second pads: the heat dissipation electrode is connected to the thermal conductive adhesive. In the MCM package structure, the thermal conductive adhesive can contact not only a bottom wall and four side walls of the accommodating recess, but also a bottom wall and four side walls of the second die, with a larger contact area therebetween, so that the heat dissipation effect on the first die and the second die can be improved.

Details of one or more embodiments of the present application will be presented in the accompanying drawings and description below: Other features, objects and advantages of the present application will become apparent from the description, the accompanying drawings and the claims.

BRIEF DESCRIPTION OF THE DRAWINGS

FIG. 15 is a flowchart illustrating a method for manufacturing the MCM package structure in FIG. 14.

Figure 1:
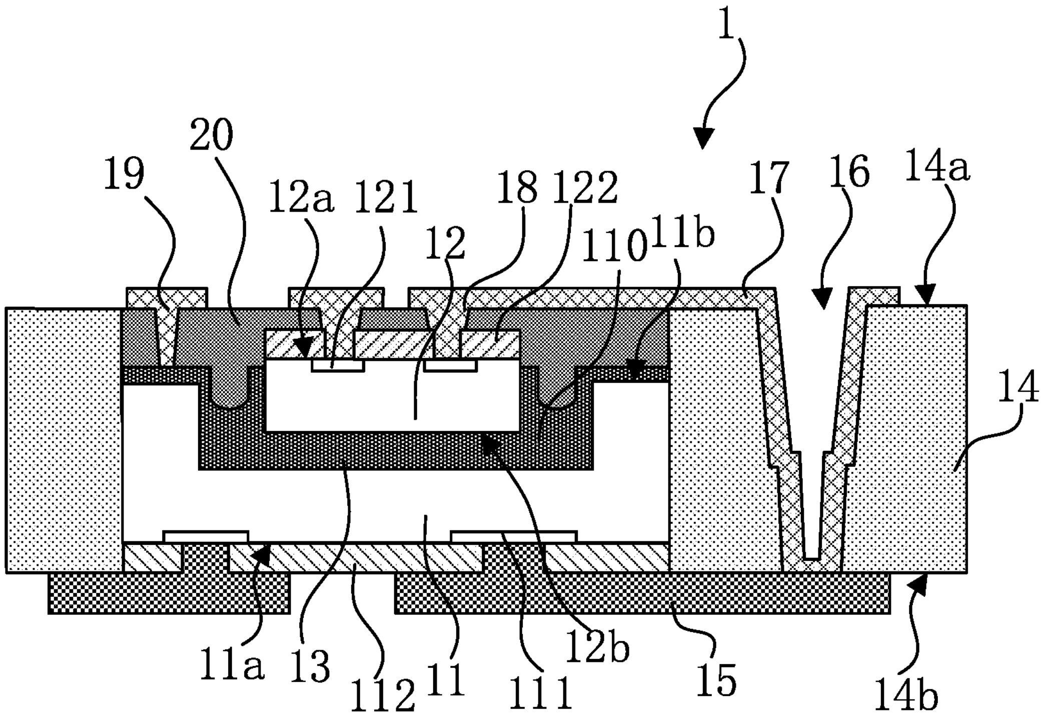
FIG. 1 is a schematic diagram illustrating a cross-sectional structure of an MCM package structure according to a first embodiment of the present disclosure.

For the convenience of understanding the present disclosure, all reference signs appearing in the present disclosure are listed below:

MCM package structure 1, 2, 3, 4, 5
First die 11
First pad 111
Back surface of first die 11*b*
Active surface of first die 11*a*
Second die 12
Second pad 121
Back surface of second die 12*b*
Active surface of second die 12*a*
Accommodating recess 110
Thermal conductive adhesive 13
Plastic encapsulation layer 14
Front surface of plastic encapsulation layer 14*a*
Back surface of plastic encapsulation layer 14*b*
First electric conductive bump 15
Through hole 16
Electric conductive layer 17
Second electric conductive bump 18
Heat dissipation electrode 19
Leveling layer 20
First protective layer 112
Second protective layer 122
Leveling layer 20
Plastic encapsulation intermediate body 10
Carrier plate 30
To-be-plastic-encapsulated part 40
Electric conductive plug 21
First end of electric conductive plug 21*a*
Second end of electric conductive plug 21*b*

DETAILED DESCRIPTION OF THE EMBODIMENTS

In order to make the objects, features and advantages of the present disclosure more apparent and easier to understand, the specific embodiments of the present disclosure will be explained in detail below with reference to the accompanying drawings.

FIG. 1 is a schematic diagram illustrating a cross-sectional structure of an MCM package structure according to a first embodiment of the present disclosure.

As shown in FIG. 1, an MCM package structure 1 includes:

- a first die 11 including a plurality of first pads 111 located on an active surface 11*a* of the first die 11, where the first die 11 is provided with an accommodating recess 110, and an opening of the accommodating recess 110 is located on a back surface 11*b* of the first die 11;
- a second die 12 including a plurality of second pads 121 located on an active surface 12*a* of the second die 12, where the second die 12 is arranged in the accommodating recess 110 and fixed with the first die 11 through a thermal conductive adhesive 13, and the active surface 12*a* of the second die 12 faces away from the active surface 11*a* of the first die 11;
- a plastic encapsulation layer 14 coating at least a side surface of the first die 11 and including a front surface 14*a* and a back surface 14*b* facing oppositely, where the front surface 14*a* of the plastic encapsulation layer 14 and the active surface 12*a* of the second die 12 face toward a same direction, and the back surface 14*b* of the plastic encapsulation layer 14 and the active surface 11*a* of the first die 11 face toward a same direction;
- a first electric conductive bump 15 located on a side of the back surface 14*b* of the plastic encapsulation layer and connected to the first pads 111;
- a through hole 16 penetrating between the front surface 14*a* of the plastic encapsulation layer 14 and the back surface 14*b* of the plastic encapsulation layer 14 and exposing the first electric conductive bump 15;
- an electric conductive layer 17 covering an inner wall of the through hole 16 and the front surface 14*a* of the plastic encapsulation layer 14 outside the through hole 16;
- a second electric conductive bump 18 located on a side of the front surface 14*a* of the plastic encapsulation layer and connected to the second pads 121, where the second electric conductive bump 18 is connected to the electric conductive layer 17;
- a heat dissipation electrode 19 located on a side of the front surface 14*a* of the plastic encapsulation layer and connected to the thermal conductive adhesive 13.

The first die 11 and the second die 12 may include power dies, memory dies, sensor dies, radio frequency dies, or corresponding control chips. Functions of the first die 11 and the second die 12 are not limited in the embodiments.

The first die 11 includes the active surface 11*a* and back surface 11*b* facing oppositely. The first pads 111 are located on the active surface 11*a*. The first die 11 may include various devices formed on a semiconductor base, and electric interconnection structures electrically connected to the devices. The first pads 111 are connected to the electric interconnection structures for inputting/outputting electric signals of the devices.

The second die 12 includes the active surface 12*a* and back surface 12*b* facing oppositely. The second pads 121 are located on the active surface 12*a*. The second die 12 may include various devices formed on a semiconductor base, and electric interconnection structures electrically connected to the devices. The second pads 121 are connected to the electric interconnection structures for inputting/outputting electric signals of the devices.

The second die 12 is arranged in the accommodating recess 110 of the first die 11, and a mutual back-to-back arrangement manner, an obliquely opposite arrangement manner, or a side-by-side arrangement manner may be adopted to reduce a volume of the MCM package structure 1. The back-to-back arrangement manner refers to that: the back surface 11*b* of the first die 11 is adhered to the back surface 12*b* of the second die 12. The obliquely opposite arrangement manner refers to that: the back surface 11*b* of the first die 11 and the back surface 12*b* of the second die 12 face toward each other, but the first die 11 and the second die 12 are misaligned in both their thickness direction and vertical thickness direction. The side-by-side arrangement manner refers to that: the back surface 11*b* of the first die 11 and the back surface 12*b* of the second die 12 face toward a same direction, and the active surface 11*a* of the first die 11 and the active surface 12*a* of the second die 12 face toward a same direction.

In this embodiment, as shown in FIG. 1, the active surface 11*a* of the first die 11 is covered with a first protective layer 112, and the active surface 12*a* of the second die 12 is covered with a second protective layer 122. Materials for the first protective layer 112 and the second protective layer 122 are insulating materials, and specifically, may include insulating resin materials or inorganic materials. The insulating resin materials include, for example, polyimide, epoxy resin, ABF (Ajinomoto buildup film), PBO (Polybenzoxazole), organic polymer film, organic polymer composite materials and other organic materials with similar insulating property. The inorganic materials include, for example, at least one of silicon dioxide, silicon nitride or the like.

The first protective layer 112 has a first opening that exposes the first pads 111. The second protective layer 122 has a second opening that exposes the second pads 121.

In other embodiments, the first protective layer 112 and/or the second protective layer 122 may be omitted, or when the materials for the second protective layer 122 are inorganic materials, ABF is provided on the second protective layer 122.

In an optional solution, the thermal conductive adhesive 13 may include copper powder and an adhesion agent. In other optional solutions, the thermal conductive adhesive 13 may include thermal conductive polymer materials and an adhesion agent.

An upper surface of the thermal conductive adhesive 13 is lower than an upper surface of the second protective layer 122.

In this embodiment, as shown in FIG. 1, the second protective layer 122 and the thermal conductive adhesive 13 are covered with a leveling layer 20. Optionally, when the back surface 11*b* of the first die 11 is not completely covered by the thermal conductive adhesive 13, a part of the back surface 11*b* that is not covered by the thermal conductive adhesive 13 is also covered with the leveling layer 20. The leveling layer 20 may be ABF.

In other embodiments, the leveling layer 20 may be omitted.

Materials for the plastic encapsulation layer 14 may include epoxy resin, polyimide resin, benzocyclobutene resin, polybenzoxazole resin, polybutylene terephthalate, polycarbonate, polyethylene glycol terephthalate, polyethylene, polypropylene, polyolefin, polyurethane, polyolefin, polyether sulfone, polyamide, polyurethane, ethylene vinyl acetate copolymers, polyvinyl alcohol, etc. The materials for the plastic encapsulation layer 14 may further include various polymers or composite materials of resin and polymers.

The plastic encapsulation layer 14 includes the front surface 14*a* and back surface 14*b* facing oppositely. In this embodiment, the leveling layer 20 is exposed by the front surface 14*a* of the plastic encapsulation layer 14, and the first protective layer 112 is exposed by the back surface 14*b* of the plastic encapsulation layer 14.

In this embodiment, the first electric conductive bump 15 is a back external connection end of the MCM package structure 1, and the second electric conductive bump 18 is a front external connection end of the MCM package structure 1. The electric conductive layer 17 enables the electric connection between the first die 11 and the second die 12.

The heat dissipation electrode 19 is connected to the thermal conductive adhesive 13. The thermal conductive adhesive 13 contacts not only a bottom wall and four side walls of the accommodating recess 110, but also a bottom wall and four side walls of the second die 12, which allows a larger contact area therebetween, so that the heat dissipation effect on the first die 11 and the second die 12 can be improved.

In another embodiment, the first electric conductive bump 15 may be replaced with a first rewiring layer. The first rewiring layer includes a plurality of metal blocks, and includes one or more layers. Some of the metal blocks are selectively electrically connected to a certain number of the first pads 111, so as to achieve the circuit layout of the first pads 111. Some of the metal blocks are electrically connected to the electric conductive layer 17, so as to lead electric signals of the first die 11 to the front surface 14*a* of the plastic encapsulation layer 14. The first rewiring layer can improve the wiring complexity of the MCM package structure 1, and increase the integration thereof.

A first dielectric layer that embeds the first rewiring layer may be disposed on the back surface 14*b* of the plastic encapsulation layer 14. In other words, the MCM package structure 1 has only the front external connection end.

In some embodiments, the first electric conductive bump 15 and the first dielectric layer may be disposed on the first rewiring layer. The first electric conductive bump 15 is exposed outside the first dielectric layer and still serves as the back external connection end.

In another embodiment, the second electric conductive bump 18 may be replaced with a second rewiring layer. The second rewiring layer includes a plurality of metal blocks, and includes one or more layers. Some of the metal blocks are selectively electrically connected to a certain number of the second pads 121, so as to achieve the circuit layout of the second pads 121. Some of the metal blocks are electrically connected to the electric conductive layer 17, so as to lead electric signals of the second die 12 to the back surface 14*b* of the plastic encapsulation layer 14. The second rewiring layer can improve the wiring complexity of the MCM package structure 1, and increase the integration thereof.

A second dielectric layer that embeds the second rewiring layer may be disposed on the leveling layer 20 and the front surface 14*a* of the plastic encapsulation layer 14. In other words, the MCM package structure 1 has only the back external connection end.

In some embodiments, the second electric conductive bump 18 and the second dielectric layer may be disposed on the second rewiring layer. The second electric conductive bump 18 is exposed outside the second dielectric layer and still serves as the front external connection end.

Materials for the first dielectric layer and the second dielectric layer may include insulating resin materials or inorganic materials. The insulating resin materials include, for example, polyimide, epoxy resin, ABF (Ajinomoto buildup film), PBO (Polybenzoxazole), organic polymer film, organic polymer composite materials and other organic materials with similar insulating property: The inorganic materials include, for example at least one of silicon dioxide, silicon nitride or the like. Compared to the inorganic materials, the insulating resin materials have a lower tensile stress, which can prevent a surface of the MCM package structure 1 from warping.

Figure 2:
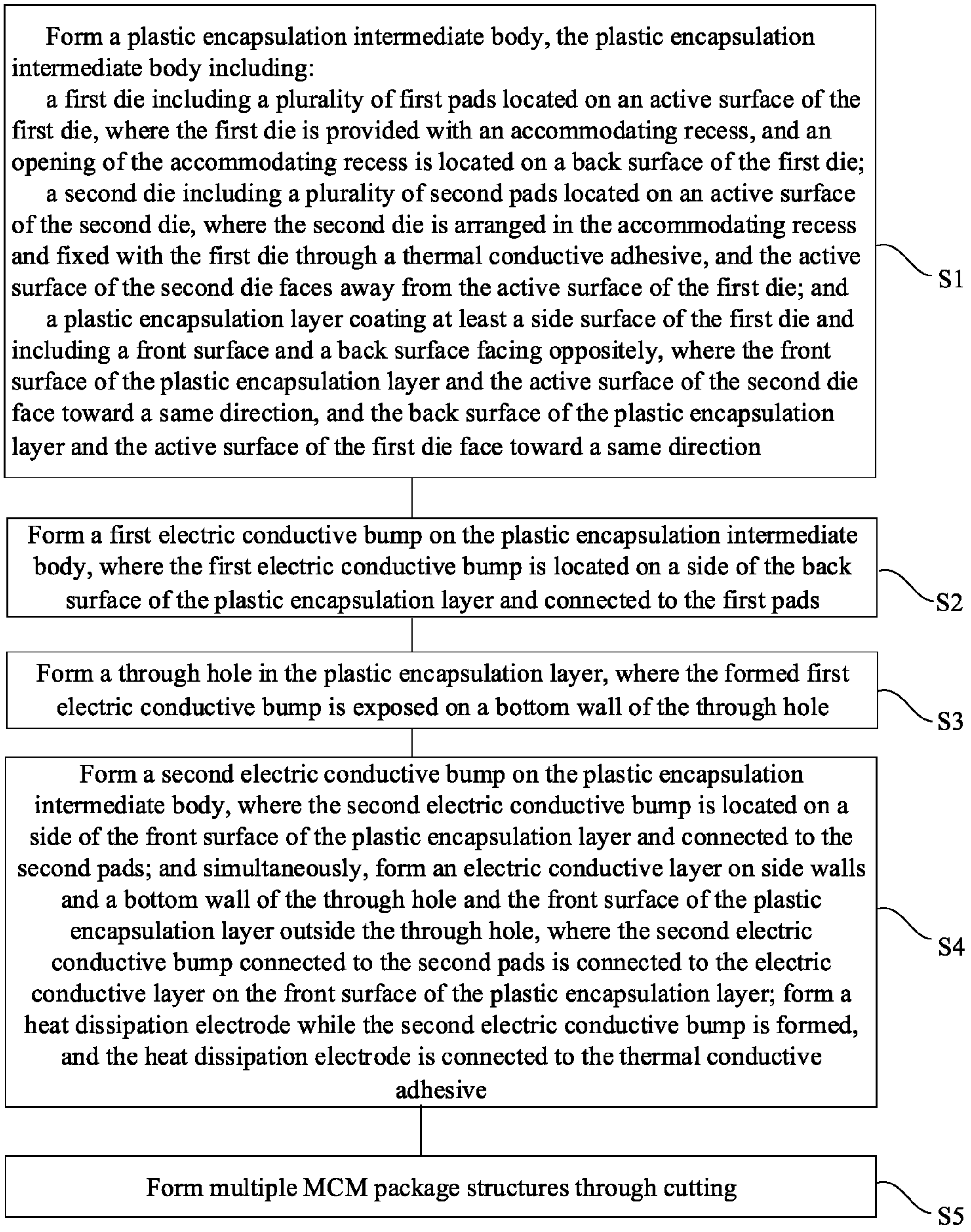
FIG. 2 is a flowchart illustrating a method for manufacturing the MCM package structure in FIG. 1.

In an embodiment of the present disclosure, a method for manufacturing the MCM package structure 1 in FIG. 1 is provided. FIG. 2 is a flowchart illustrating the manufacturing method. FIGS. 3 to 11 are schematic diagrams illustrating intermediate structures corresponding to processes in FIG. 2.

Figure 3:
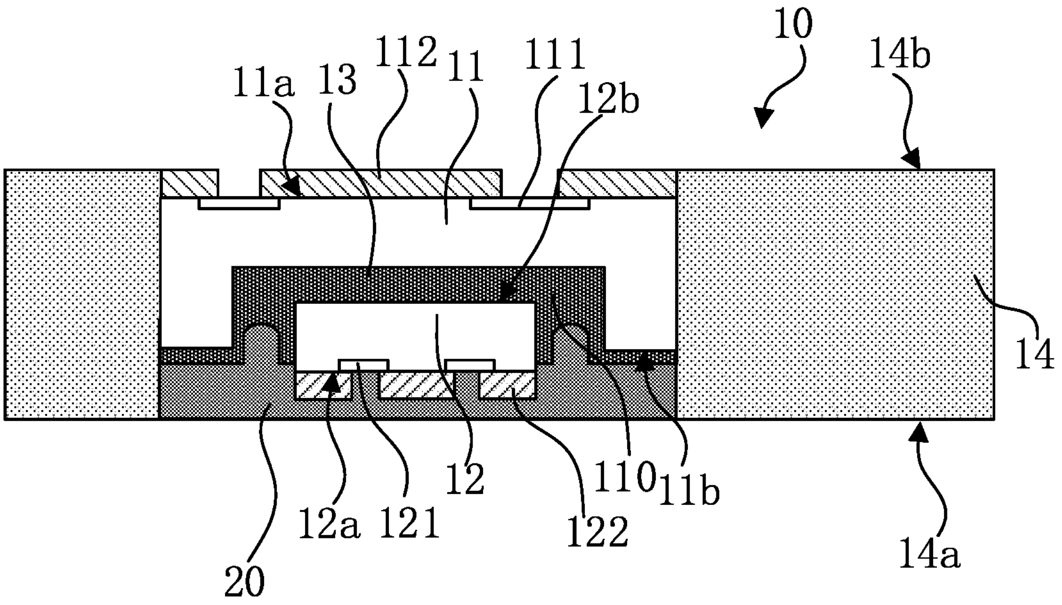
FIGS. 3 to 11 are schematic diagrams illustrating intermediate structures corresponding to processes in FIG. 2.

First, referring to step S1 in FIG. 2 and FIG. 3, a plastic encapsulation intermediate body 10 is formed, the plastic encapsulation intermediate body including:

- a first die 11 including a plurality of first pads 111 located on an active surface 11*a* of the first die 11, where the first die 11 is provided with an accommodating recess 110, and an opening of the accommodating recess 110 is located on a back surface 11*b* of the first die 11;
- a second die 12 including a plurality of second pads 121 located on an active surface 12*a* of the second die 12, where the second die 12 is arranged in the accommodating recess 110 and fixed with the first die 11 through a thermal conductive adhesive 13, and the active surface 12*a* of the second die 12 faces away from the active surface 11*a* of the first die 11; and
- a plastic encapsulation layer 14 coating at least a side surface of the first die 11 and including a front surface 14*a* and a back surface 14*b* facing oppositely, where the front surface 14*a* of the plastic encapsulation layer 14 and the active surface 12*a* of the second die 12 face toward a same direction, and the back surface 14*b* of the plastic encapsulation layer 14 and the active surface 11*a* of the first die 11 face toward a same direction.

In this embodiment, forming the plastic encapsulation intermediate body 10 may include steps S11 to S12.

Figure 4:
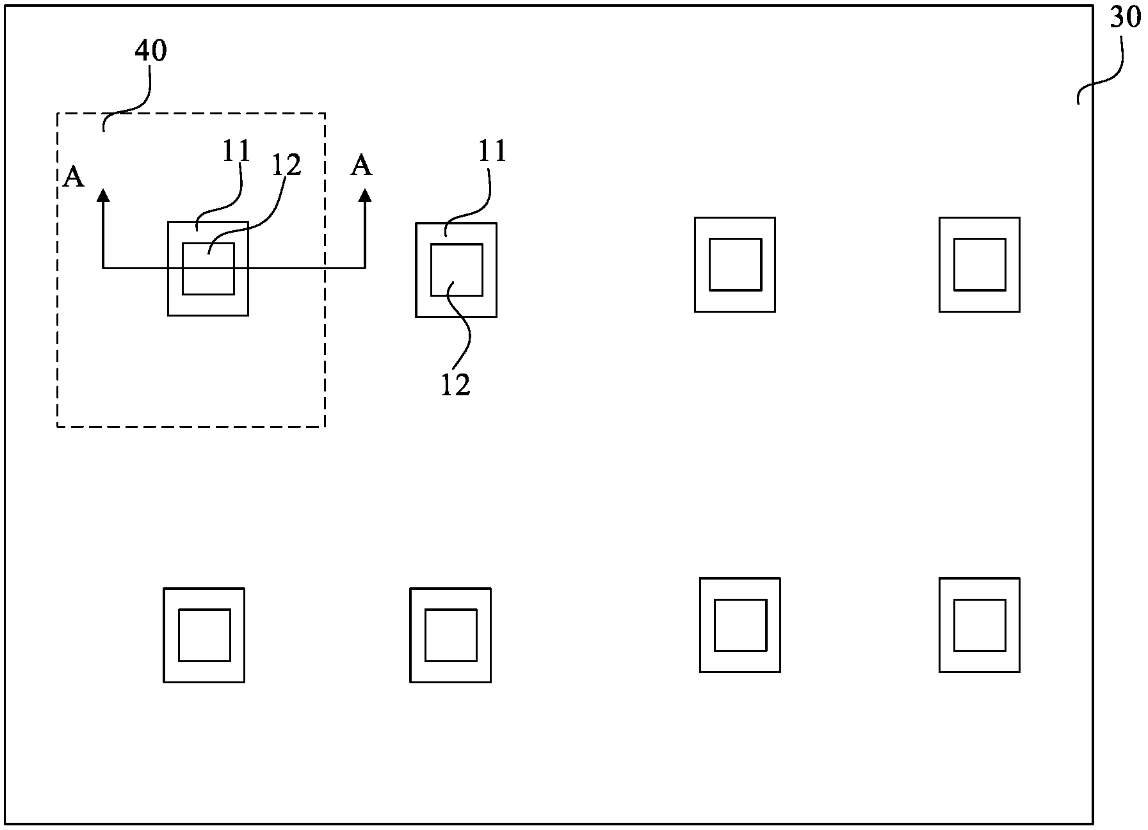
Figure 5:
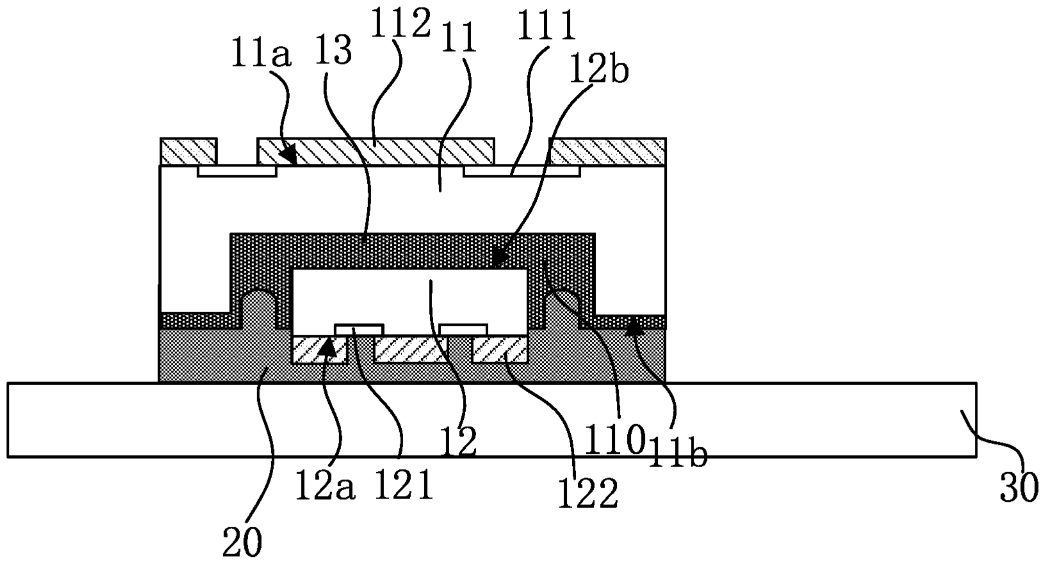

At step S11, as shown in FIGS. 4 and 5, a carrier plate 30 and multiple sets of to-be-plastic-encapsulated parts 40 carried on the carrier plate 30 are provided. Each set of to-be-plastic-encapsulated parts 40 includes: the first die 11 and the second die 12, where the first die 11 includes the plurality of first pads 111 located on the active surface 11*a* of the first die 11, the first die 11 is provided with the accommodating recess 110, and the opening of the accommodating recess 110 is located on the back surface 11*b* of the first die 11: the second die 12 includes the plurality of second pads 121 located on the active surface 12*a* of the second die 12, the second die 12 is arranged in the accommodating recess 110 and fixed with the first die 11 through the thermal conductive adhesive 13, and the active surface 12*a* of the second die 12 faces away from the active surface 11*a* of the first die 11, where the active surface 11*a* of the first die 11 faces toward the carrier plate 30. FIG. 4 is a top view illustrating the carrier plate and the multiple sets of to-be-plastic-encapsulated parts. FIG. 5 is a cross-sectional view along a line AA in FIG. 4.

The accommodating recess 110 may be accomplished through dry etching or wet etching. During the dry etching or the wet etching, the back surface 11*b* of the first die 11 is covered with a mask layer, and a mask plate used for exposure of the mask layer may be aligned with the help of the first pads 111 located on the active surface 11*a* of the first die 11. For example, a position of the first pads 111 may be acquired by using the technology of infrared penetration through the first die 11.

In this embodiment, as shown in FIG. 5, the active surface 11*a* of the first die 11 is covered with a first protective layer 112, and the active surface 12*a* of the second die 12 is covered with a second protective layer 122. Materials for the first protective layer 112 and the second protective layer 122 are insulating materials, and specifically, may include insulating resin materials or inorganic materials. The insulating resin materials include, for example, polyimide, epoxy resin, ABF (Ajinomoto buildup film), PBO (Polybenzoxazole), organic polymer film, organic polymer composite materials and other organic materials with similar insulating property. The inorganic materials include, for example, at least one of silicon dioxide, silicon nitride or the like.

The first protective layer 112 includes a first opening that exposes the first pads 111. The second protective layer 122 includes a second opening that exposes the second pads 121.

In other embodiments, the first protective layer 112 and/or the second protective layer 122 may be omitted.

In this embodiment, a method for forming a set of to-be-plastic-encapsulated parts 40 in step S11 may include steps S111 to S114.

At step S111, the first die 11 is provided, and a semi-solid thermal conductive adhesive is disposed in the accommodating recess 110.

The semi-solid thermal conductive adhesive may include copper powder and an adhesion agent, or thermal conductive polymer materials and an adhesion agent. The semi-solid thermal conductive adhesive may be brushed inside the accommodating recess 110 with a brush head.

At step S112, the second die 12 is provided, the active surface 12*a* of the second die 12 faces away from the active surface 11*a* of the first die 11, and the second die 12 is arranged in the accommodating recess 110.

When the second die 12 is arranged in the accommodating recess 110, the second die 12 is embedded in the semi-solid thermal conductive adhesive.

At step S113, the semi-solid thermal conductive adhesive is solidified to fix the second die 12 and the first die 11.

The semi-solid thermal conductive adhesive may be solidified through heating to volatilize organic matter in the adhesion agent, thereby being densified and hardened.

In this embodiment, after step S112 and before step S113, the semi-solid thermal conductive adhesive is filled between the accommodating recess 110 and the second die 12, and the semi-solid thermal conductive adhesive contacts at least a portion of side walls of the accommodating recess 110, at least a portion of side walls of the second die 12, a bottom wall of the accommodating recess 110, and a bottom wall of the second die 12.

At step S114, the second protective layer 122, the second pads 121, the thermal conductive adhesive 13, and the back surface 11*b* of the first die 11 are covered with a leveling layer 20. The leveling layer 20 may be ABF.

In another embodiment, a method for forming a set of to-be-plastic-encapsulated parts 40 in step S11 may include steps S111' to S114.

At step S111', the first die 11 is provided, and a liquid thermal conductive adhesive is disposed in the accommodating recess 110 and semi-solidified to form a semi-solid thermal conductive adhesive.

The liquid thermal conductive adhesive may include: a liquid metal electric conductive adhesive and/or a liquid carbon electric conductive adhesive. The liquid thermal conductive adhesive may be semi-solidified through heating.

At step S112, the second die 12 is provided, the active surface 12*a* of the second die 12 faces away from the active surface 11*a* of the first die 11, and the second die 12 is arranged in the accommodating recess 110.

When the second die 12 is arranged in the accommodating recess 110, the second die 12 is embedded in the semi-solid thermal conductive adhesive.

At step S113, the semi-solid thermal conductive adhesive is solidified to fix the second die 12 and the first die 11.

The semi-solid thermal conductive adhesive may be solidified through heating to volatilize organic matter in the semi-solidified metal thermal conductive adhesive and/or the semi-solidified carbon thermal conductive adhesive, thereby being densified and hardened.

At step S114, the second protective layer 122, the second pads 121, the thermal conductive adhesive 13, and the back surface 11*b* of the first die 11 are covered with a leveling layer 20. The leveling layer 20 may be ABF.

The carrier plate 30 is a hard plate, and may include a plastic plate, a glass plate, a ceramic plate, a metal plate or the like.

When the multiple sets of to-be-plastic-encapsulated parts 40 are arranged on a surface of the carrier plate 30, an adhesive layer may be applied to the whole surface of the carrier plate 30, and the multiple sets of to-be-plastic encapsulated parts 40 may be placed on the adhesive layer.

The adhesive layer may be made of materials that are easy to peel off, so that the carrier plate 30 can be peeled off. For example, thermal separation materials that can lose their adhesiveness through heating or UV separation materials that can lose their adhesiveness through UV irradiation may be used.

A set of to-be-plastic-encapsulated parts 40 is located in a region on the surface of the carrier plate 30 for subsequent cutting. Multiple sets of to-be-plastic-encapsulated parts 40 are fixed on the surface of the carrier plate 30, so that multiple MCM package structures 1 can be simultaneously produced, which is beneficial to mass production and cost reduction. In some embodiments, a set of to-be-plastic-encapsulated parts 40 may be fixed on the surface of the carrier plate 30.

Figure 6:
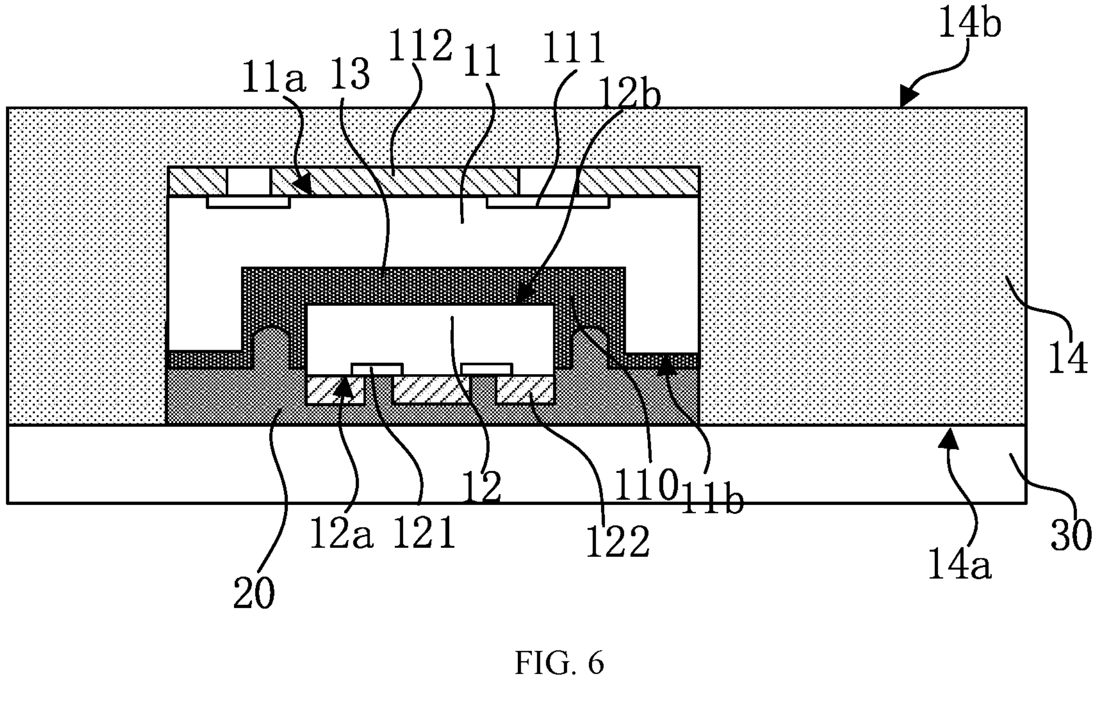
Figure 7:
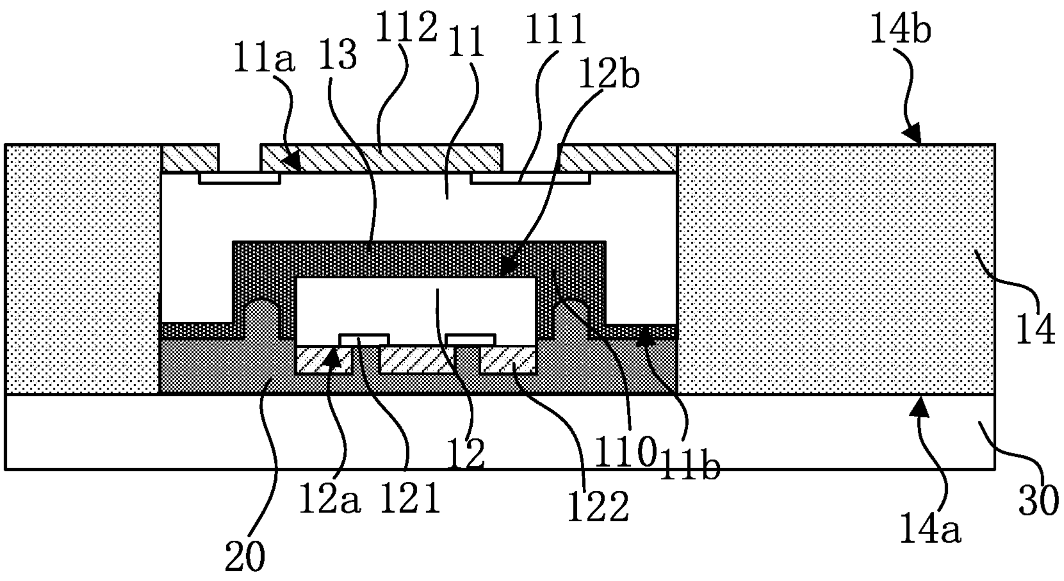

At step S12, as shown in FIG. 6, the plastic encapsulation layer 14 that embeds each set of to-be-plastic-encapsulated parts 40 is formed on the surface of the carrier plate 30; as shown in FIG. 7, the plastic encapsulation layer 14 is thinned from the back surface 14*b* of the plastic encapsulation layer 14 until the active surface 11*a* of the first die 11 is exposed.

Materials for the plastic encapsulation layer 14 may include epoxy resin, polyimide resin, benzocyclobutene resin, polybenzoxazole resin, polybutylene terephthalate, polycarbonate, polyethylene glycol terephthalate, polyethylene, polypropylene, polyolefin, polyurethane, polyolefin, polyether sulfone, polyamide, polyurethane, ethylene vinyl acetate copolymers, polyvinyl alcohol, etc. The materials for the plastic encapsulation layer 14 may further include various polymers or composite materials of resin and polymers. Correspondingly, plastic encapsulation may include first filling liquid plastic encapsulation materials, and then performing high-temperature solidification through a plastic encapsulation mold. In some embodiments, the plastic encapsulation layer 14 may be formed in a manner of plastic material molding such as hot-press molding and transfer molding.

The plastic encapsulation layer 14 may include a front surface 14*a* and a back surface 14*b* facing oppositely.

As shown in FIG. 7, mechanical grinding, for example, grinding with a grinding wheel, may be used to thin the plastic encapsulation layer 14.

In this embodiment, since there is the first protective layer 112 on the active surface 11*a* of the first die 11, the plastic encapsulation layer 14 is thinned from the back surface 14*b* of the plastic encapsulation layer 14 until the first protective layer 112 is exposed.

During the formation of the plastic encapsulation layer 14 and the grinding of the plastic encapsulation layer 14, the first protective layer 112 and the second protective layer 122 can prevent damages to electric interconnection structures and devices within the first pads 111, the first die 11, the second pads 121 and the second die 12.

In other embodiments, when the plastic encapsulation intermediate body 10 is formed, in each set of to-be-plastic-encapsulated parts 40, the active surface 12*a* of the second die 12 faces toward the carrier plate 30. Then, the plastic encapsulation layer 14 is thinned from the front surface 14*a* of the plastic encapsulation layer 14 until the active surface 12*a* of the second die 12 is exposed. When there is the second protective layer 122 on the active surface 12*a* of the second die 12, the plastic encapsulation layer 14 is thinned from the front surface 14*a* of the plastic encapsulation layer 14 until the second protective layer 122 is exposed.

Figure 8:
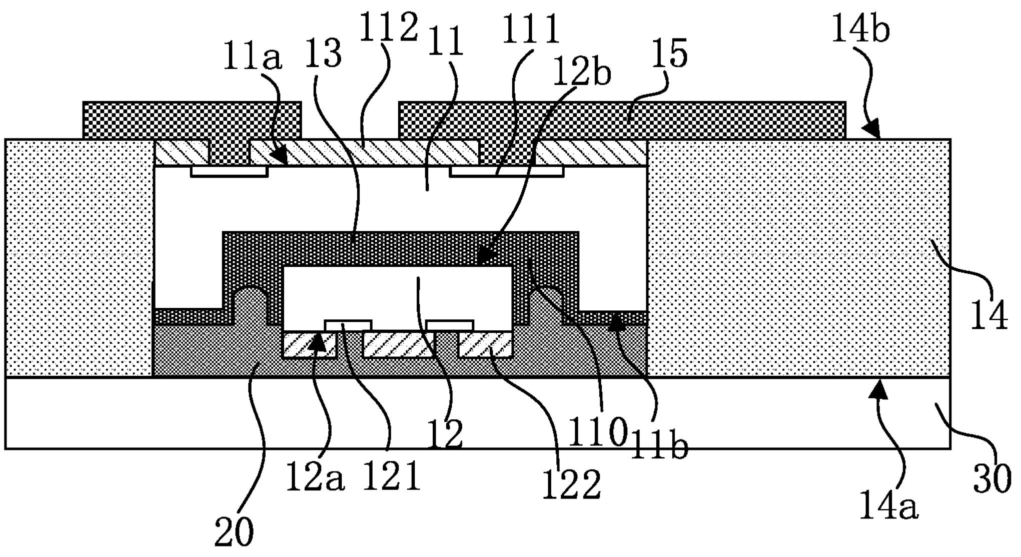

Next, referring to step S2 in FIG. 2 and FIG. 8, a first electric conductive bump 15 is formed on the plastic encapsulation intermediate body 10, and the first electric conductive bump 15 is located on a side of the back surface 14*b* of the plastic encapsulation layer and connected to the first pads 111.

The first electric conductive bump 15 may be accomplished through electroplating. The technology of electroplating copper or aluminum is relatively mature.

In this embodiment, the first electric conductive bump 15 serves as a back external connection end of the MCM package structure 1.

In other embodiments, an anti-oxidation layer may be formed on the first electric conductive bump 15.

The anti-oxidation layer may include: a1) a tin layer, or a2) a nickel layer and a gold layer stacked from bottom to top, or a3) a nickel layer, a palladium layer and a gold layer stacked from bottom to top. The anti-oxidation layer may be formed through electroplating. Materials for the first electric conductive bump 15 may be copper, and the anti-oxidation layer can prevent copper oxidation, and further prevent deterioration of electric connection performance due to the copper oxidation.

In another embodiment, the first electric conductive bump 15 may be replaced with a first rewiring layer. The first rewiring layer includes a plurality of metal blocks, and includes one or more layers. Some of the metal blocks are selectively electrically connected to a certain number of the first pads 111, so as to achieve the circuit layout of the first pads 111. Some of the metal blocks are electrically connected to the electric conductive layer 17, so as to lead electric signals of the first die 11 to the front surface 14*a* of the plastic encapsulation layer 14. The first rewiring layer can improve the wiring complexity of the MCM package structure, and increase the integration thereof.

A first dielectric layer that embeds the first rewiring layer may be disposed on the back surface 14*b* of the plastic encapsulation layer 14. In other words, the MCM package structure has only a front external connection end.

In some embodiments, the first electric conductive bump 15 may be disposed on the first rewiring layer. The first electric conductive bump 15 is exposed outside the first dielectric layer and still serves as the back external connection end.

After the first electric conductive bump 15 is formed, the carrier plate 30 may be removed. Manners for removing the carrier plate 30 may be laser peeling, UV irradiation, and other existing removal manners.

Figure 9:
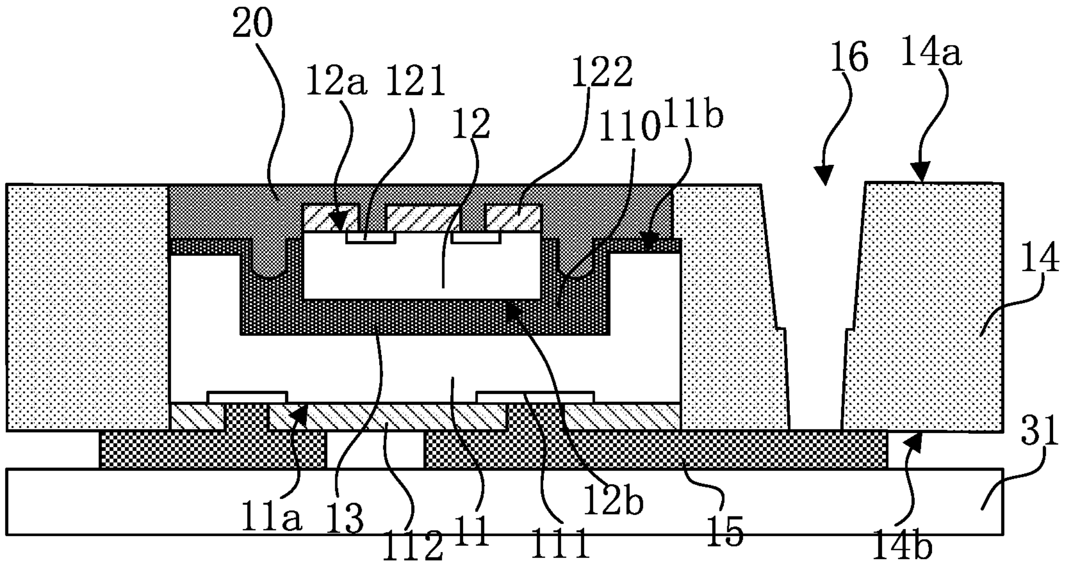

Next, referring to step S3 in FIG. 2 and FIG. 9, a through hole 16 is formed in the plastic encapsulation layer 14, and the formed first electric conductive bump 15 is exposed on a bottom wall of the through hole 16.

The through hole 16 may be formed through laser drilling.

As shown in FIG. 9, after the carrier plate 30 is removed, a support plate 31 may be disposed on the first electric conductive bump 15.

The support plate 31 is a hard plate, and may include a glass plate, a ceramic plate, a metal plate or the like.

Figure 10:
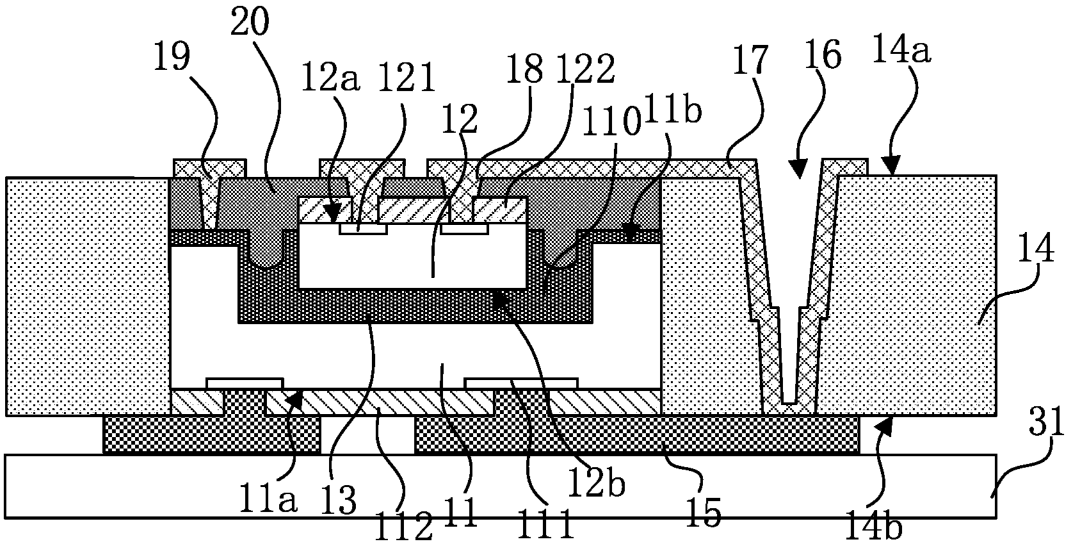

Then, referring to step S4 in FIG. 2 and FIG. 10, a second electric conductive bump 18 is formed on the plastic encapsulation intermediate body 10, and the second electric conductive bump 18 is located on a side of the front surface 14*a* of the plastic encapsulation layer and connected to the second pads 121. Simultaneously, an electric conductive layer 17 is formed on side walls and a bottom wall of the through hole 16 and the front surface 14*a* of the plastic encapsulation layer outside the through hole 16. The second electric conductive bump 18 connected to the second pads 121 is connected to the electric conductive layer 17 on the front surface 14*a* of the plastic encapsulation layer. A heat dissipation electrode 19 is formed while the second electric conductive bump 18 is formed, and the heat dissipation electrode 19 is connected to the thermal conductive adhesive 13.

Before the second electric conductive bump 18 is formed, openings that expose the second pads 121 and the thermal conductive adhesive 13 are formed in the leveling layer 20 first.

In this embodiment, in the second die 12, the second protective layer 122 includes the second opening that exposes the second pads 121. Therefore, a portion of a thickness of the leveling layer 20 is removed through laser drilling first, and a portion thereof is retained, where the retained thickness may be 3 μm~5 μm: afterwards, a portion of the thickness of the leveling layer 20 is removed through plasma cleaning to expose the second pads 121. The energy of plasma cleaning is lower than that of laser drilling, which can prevent a damage to the second pads 121 when the second pads 121 are exposed through laser drilling.

In addition, in order to prevent damages to the leveling layer 20 and the plastic encapsulation layer 14 due to plasma cleaning, a metal mask layer may be formed on the leveling layer 20 and the front surface of the plastic encapsulation layer 14, and materials for the metal mask layer may be copper. After the second pads 121 are exposed, the metal mask layer is removed.

For the formation of the opening that exposes the thermal conductive adhesive 13 in the leveling layer 20, reference may be made to the method for forming the opening that exposes the second pads 121.

The second electric conductive bump 18 may be accomplished through electroplating. The technology of electroplating copper or aluminum is relatively mature. In this embodiment, the second electric conductive bump 18 serves as a front external connection end of the MCM package structure 1.

In other embodiments, an anti-oxidation layer may be formed on the second electric conductive bump 18.

The anti-oxidation layer may include: b1) a tin layer, or b2) a nickel layer and a gold layer stacked from bottom to top, or b3) a nickel layer, a palladium layer and a gold layer stacked from bottom to top. The anti-oxidation layer may be formed through electroplating. Materials for the second electric conductive bump 18 may be copper, and the anti-oxidation layer can prevent copper oxidation, and further prevent deterioration of electric connection performance due to the copper oxidation.

In another embodiment, the second electric conductive bump 18 may be replaced with a second rewiring layer. The second rewiring layer includes a plurality of metal blocks, with one or more layers. Some of the metal blocks are selectively electrically connected to a certain number of the second pads 121, so as to achieve the circuit layout of the second pads 121. Some of the metal blocks are electrically connected to the electric conductive layer 17, so as to lead electric signals of the second die 12 to the back surface 14*b* of the plastic encapsulation layer 14. The second rewiring layer can improve the wiring complexity of the MCM package structure, and increase the integration thereof.

A second dielectric layer that embeds the second rewiring layer may be disposed on the leveling layer 20 and the front surface 14*a* of the plastic encapsulation layer 14. In other words, the MCM package structure has only the back external connection end.

In some embodiments, the second electric conductive bump 18 may be disposed on the second rewiring layer. The second electric conductive bump 18 is exposed outside the second dielectric layer and still serves as the front external connection end.

Figure 11:
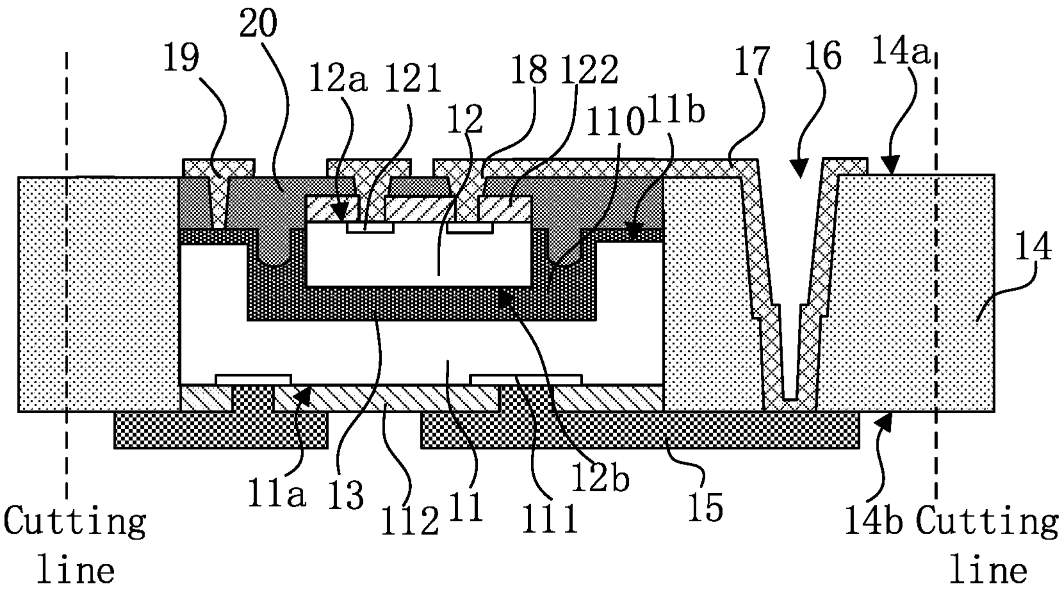

After the second electric conductive bump 18 is formed, as shown in FIG. 11, the support plate 31 is removed.

Manners for removing the support plate 31 may be laser peeling. UV irradiation, and other existing removal manners.

Then, referring to step S5 in FIG. 2 and FIGS. 11 and 1, multiple MCM package structures 1 are formed through cutting.

Each of the MCM package structures 1 includes a set of to-be-plastic-encapsulated parts 40.

In other embodiments, the second electric conductive bump 18 may be formed first, and then the first electric conductive bump 15 is formed. The through hole 16 exposes the second electric conductive bump 18.

Figure 12:
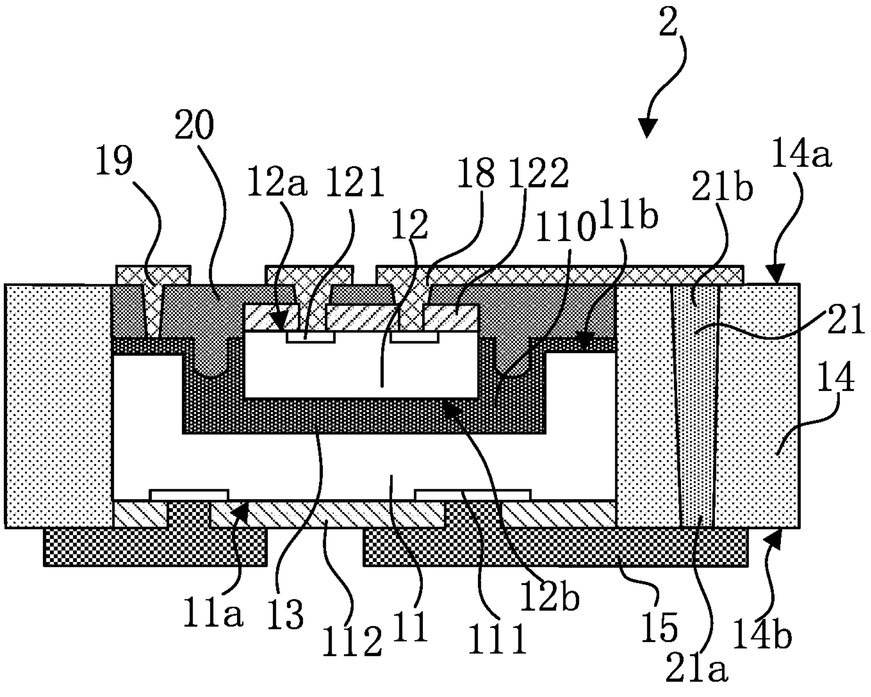
FIG. 12 is a schematic diagram illustrating a cross-sectional structure of an MCM package structure according to a second embodiment of the present disclosure.

FIG. 12 is a schematic diagram illustrating a cross-sectional structure of an MCM package structure according to a second embodiment of the present disclosure.

As shown in FIGS. 12 and 1, a difference between an MCM package structure 2 in this embodiment and the MCM package structure 1 in the first embodiment lies merely in that: the through hole 16 and the electric conductive layer 17 located on the inner wall of the through hole 16 are replaced with an electric conductive plug 21. In other words, in the MCM package structure 2, the electric conductive plug 21 is used as an electric connection structure to achieve the electric connection between the first die 11 and the second die 12.

Figure 13:
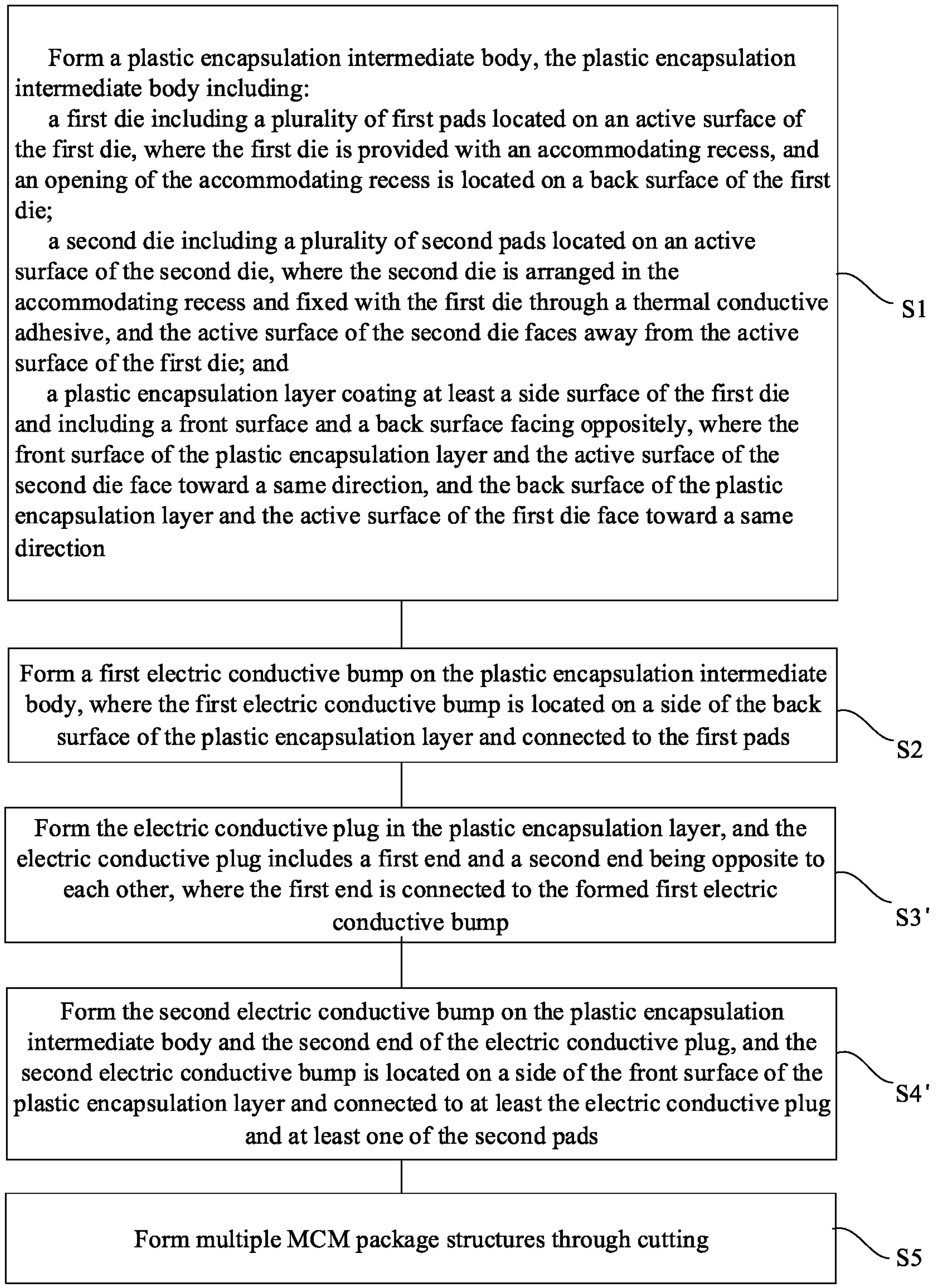
FIG. 13 is a flowchart illustrating a method for manufacturing the MCM package structure in FIG. 12.

FIG. 13 is a flowchart illustrating a method for manufacturing the MCM package structure in FIG. 12. As shown in FIGS. 13 and 2, differences between the method for manufacturing the MCM package structure 2 in this embodiment and that for manufacturing the MCM package structure 1 in the first embodiment lie merely in that: at step S3', the electric conductive plug 21 is formed in the plastic encapsulation layer 14, and the electric conductive plug 21 includes a first end 21*a* and a second end 21*b* being opposite to each other, where the first end 21*a* is connected to the formed first electric conductive bump 15: at step S4', the second electric conductive bump 18 is formed on the plastic encapsulation intermediate body 10 and the second end of the electric conductive plug 21, and the second electric conductive bump 18 is located on a side of the front surface 14*a* of the plastic encapsulation layer and connected to at least the electric conductive plug 21 and at least one of the second pads 121.

A method for forming the electric conductive plug 21 may include: first forming an opening in the plastic encapsulation layer 14 through laser drilling, and then filling the electric conductive layer in the opening through electroplating.

Except for the above differences, for other structures of the MCM package structure 2 in this embodiment and other steps in their manufacturing methods, reference may be made to other structures of the MCM package structure 1 in the aforementioned embodiments and other steps in their manufacturing methods.

Figure 14:
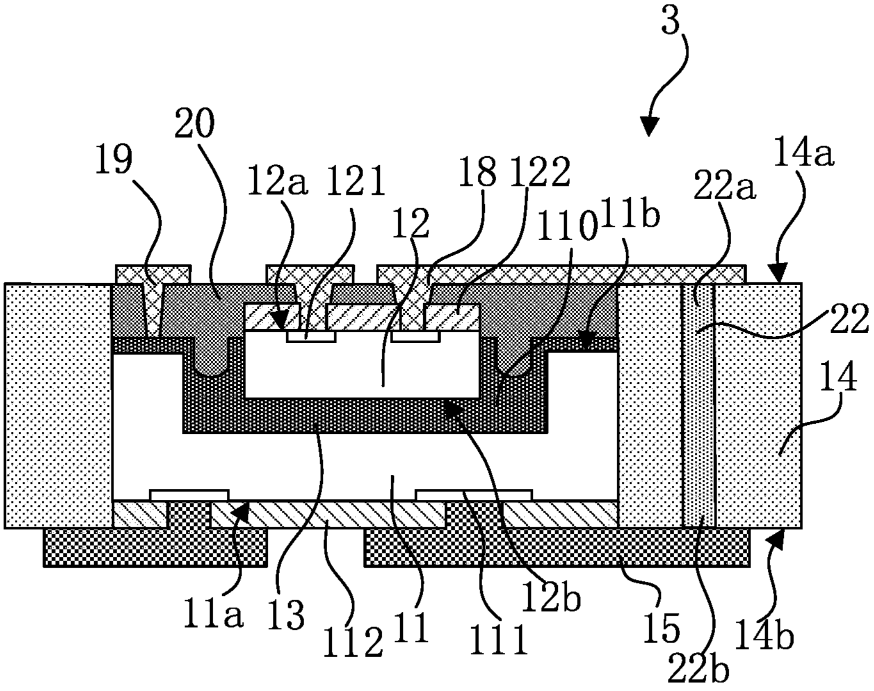
FIG. 14 is a schematic diagram illustrating a cross-sectional structure of an MCM package structure according to a third embodiment of the present disclosure.

FIG. 14 is a schematic diagram illustrating a cross-sectional structure of an MCM package structure according to a third embodiment of the present disclosure.

As shown in FIGS. 14, 1 and 12, a difference between an MCM package structure 3 in this embodiment and the MCM package structures 1 and 2 in the first and second embodiments lies merely in that: the through hole 16 and the electric conductive layer 17 located on the inner wall of the through hole 16 are replaced with an electric conductive column 22. In other words, in the MCM package structure 3, the electric conductive column 22 is used as an electric connection structure to achieve the electric connection between the first die 11 and the second die 12.

FIG. 15 is a flowchart illustrating a method for manufacturing the MCM package structure in FIG. 14. As shown in FIGS. 15, 2 and 13, differences between the method for manufacturing the MCM package structure 3 in this embodiment and that for manufacturing the MCM package structures 1 and 2 in the first and second embodiments lie merely in that: at step S1', the plastic encapsulation intermediate body 10 includes the electric conductive column 22: the plastic encapsulation layer 14 coats the electric conductive column 22: the front surface 14*a* of the plastic encapsulation layer 14, the active surface 12*a* of the second die 12, and a first end 22*a* of the electric conductive column 22 face toward a same direction, and the back surface 14*b* of the plastic encapsulation layer 14, the active surface 11*a* of the first die 11, and the second end 22*b* of the electric conductive column 22 face toward a same direction: at step S2', the first electric conductive bump 15 is located on a side of the back surface 14*b* of the plastic encapsulation layer and connected to at least the electric conductive column 22 and at least one of the first pads 111: step S3 is omitted: at step S4", the second electric conductive bump 18 is located on a side of the front surface 14*a* of the plastic encapsulation layer and connected to at least the electric conductive column 22 and at least one of the second pads 121.

In other words, in the method for forming the plastic encapsulation intermediate body 10, in addition to the first die 11 and the second die 12, each set of to-be-plastic-encapsulated parts 40) includes the electric conductive column 22.

Except for the above differences, for other structures of the MCM package structure 3 in this embodiment and other steps in their manufacturing methods, reference may be made to other structures of the MCM package structures 1 and 2 in the aforementioned embodiments and other steps in their manufacturing methods.

Figure 16:
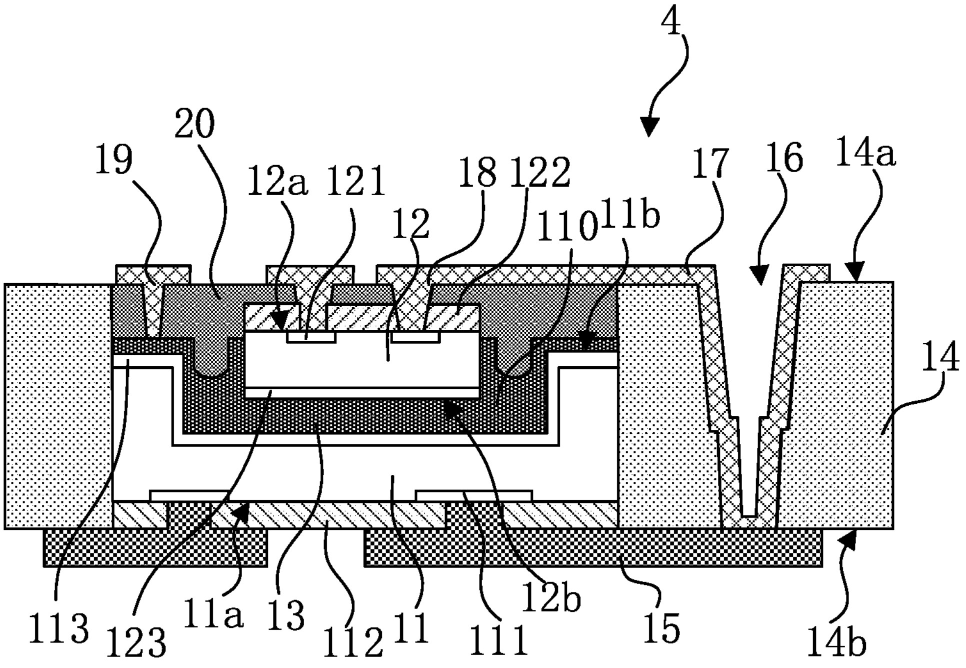
FIG. 16 is a schematic diagram illustrating a cross-sectional structure of an MCM package structure according to a fourth embodiment of the present disclosure.

FIG. 16 is a schematic diagram illustrating a cross-sectional structure of an MCM package structure according to a fourth embodiment of the present disclosure.

As shown in FIGS. 16, 1, 12 and 14, differences between an MCM package structure 4 in this embodiment and the MCM package structures 1, 2 and 3 in the first, second and third embodiments lie merely in that: the first die 11 includes a first back electrode 113 located on the back surface 11*b* of the first die 11: the second die 12 includes a second back electrode 123 located on the back surface 12*b* of the second die 12: the thermal conductive adhesive 13 has an electric conductive function, and the heat dissipation electrode 19 is configured to electrically connect to a constant potential.

When the first die 11 and the second die 12 are IGBT (Insulate-Gate Bipolar Transistor) dies, the first back electrode 113 and the second back electrode 123 are drain electrodes and may be grounded.

The thermal conductive adhesive 13 that has the electric conductive function may include nano-copper/electric conductive polymer composite materials. The nano-copper/electric conductive polymer composite materials are composite materials formed by adding nano-copper particles to electric conductive polymers and uniformly dispersing the nano-copper particles in the electric conductive polymers.

The nano-copper/electric conductive polymer composite materials, when being disposed in the accommodating recess 110, are of a solid flat-sheet structure. A temperature can be increased above a glass transition temperature of the electric conductive polymer materials through heating. At this time, the electric conductive polymer materials are changed from a solid to a semi-liquid having certain viscosity, so that the first die 11 and the second die 12 are adhered together.

In the nano-copper/electric conductive polymer composite materials, the electric conductive polymers may include at least one of polypyrrole, polythiophene, polyaniline or polyphenylene sulfide. The electric conductive polymers are polymers with conjugated x-bonds that undergo chemical or electrochemical "doping" so that the polymers are transformed from an insulator into a conductor. The electric conductive polymers have an excellent electric conductivity, and the electric conductivity is further enhanced after the addition of nano-copper.

The copper material is one of metal materials with the best electric conductivity, and when the scale of copper is reduced to a nanoscale, the material has better electric and thermal conductivities due to its large specific surface area and high surface activity energy. Preferably, nano-copper is in a spherical shape, with a particle size less than 800 nm: further preferably, the particle size of nano-copper is in a range of 200 nm~500 nm. This is because: the specific surface area of the nano-copper material is increased as the particle size of the material is reduced, and the electric and thermal conductivities of the material are enhanced accordingly: when the particle size is reduced to 800 nm or below; the material exhibits excellent electric and thermal conductivities: however, when the particle size continues to be reduced to 200 nm or below; the cost of the nano-material is increased significantly, which will affect the economic benefit of package, and when the particle size of nano-copper is reduced to 200 nm or blow; the surface energy of the nano-copper particles is increased, and the particles are easily aggregated to form larger particles, which will damage the electric and thermal conductivities of the composite materials.

Preferably, in the nano-copper/electric conductive polymer composite materials, an added amount of nano-copper is greater than 5 wt %.

Except for the above differences, for other structures of the MCM package structure 4 in this embodiment, reference may be made to other structures of the MCM package structures 1 and 2 in the aforementioned embodiments.

For a method for manufacturing the MCM package structure 4, reference may be made to that for manufacturing the MCM package structures 1, 2 and 3 in the first, second and third embodiments.

Figure 17:
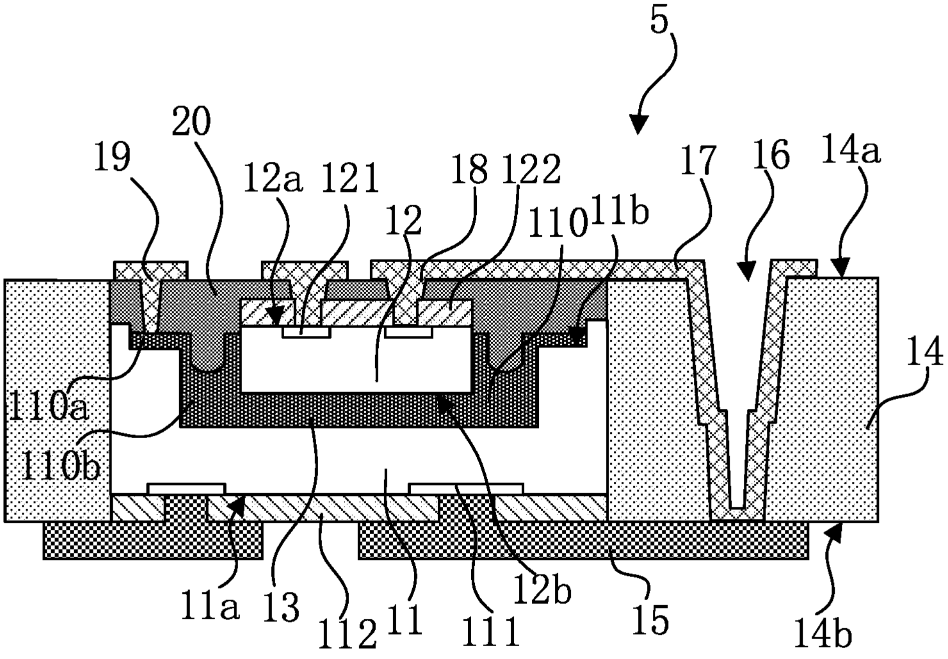
FIG. 17 is a schematic diagram illustrating a cross-sectional structure of an MCM package structure according to a fifth embodiment of the present disclosure.

FIG. 17 is a schematic diagram illustrating a cross-sectional structure of an MCM package structure according to a fifth embodiment of the present disclosure.

As shown in FIGS. 17, 16, 1, 12 and 14, a difference between an MCM package structure 5 in this embodiment and the MCM package structures 1, 2, 3 and 4 in the first, second, third and fourth embodiments lies merely in that: the accommodating recess 110 is in a stepped shape.

In this embodiment, a first recess 110*a* may be disposed on the back surface 11*b* of the first die 11, and then a second recess 110*b* may be disposed in the first recess 110*a*. A depth of the second recess 110*b* is greater than that of the first recess 110*a*. The second recess 110*b* is the accommodating recess 110. The first recess 110*a* may be used to define the region of the thermal conductive adhesive 13.

In other embodiments, continuously, a third recess may be disposed in the second recess 110*b*, . . . , a depth of the third recess is greater than that of the second recess 110*b*, . . . .

Except for the above differences, for other structures of the MCM package structure 5 in this embodiment and other steps in their manufacturing methods, reference may be made to other structures of the MCM package structures 1, 2, 3 and 4 in the aforementioned embodiments and other steps in their manufacturing methods.

Although the present disclosure is disclosed above, the present disclosure is not limited thereto. Any person skilled in the art can make various changes and modifications without departing from the spirit and scope of the present disclosure. Therefore, the protection scope of the present disclosure should be based on the scope defined by the claims.

The invention claimed is:

1. An MCM package structure, comprising:

a first die, comprising first pads located on an active surface of the first die, wherein the first die is provided with an accommodating recess, and an opening of the accommodating recess is located on a back surface of the first die;

a second die, comprising second pads located on an active surface of the second die, wherein the second die is arranged in the accommodating recess and fixed with the first die through a thermal conductive adhesive, and the active surface of the second die faces away from the active surface of the first die;

a plastic encapsulation layer, coating at least a side surface of the first die, and comprising a front surface and a back surface facing oppositely, wherein the front surface of the plastic encapsulation layer and the active surface of the second die face toward a same direction, and the back surface of the plastic encapsulation layer and the active surface of the first die face toward a same direction;

an electric connection structure, penetrating between the front surface of the plastic encapsulation layer and the back surface of the plastic encapsulation layer;

a first electric conductive structure, located on a side of the back surface of the plastic encapsulation layer and connected to at least the electric connection structure and at least one of the first pads;

a second electric conductive structure, located on a side of the front surface of the plastic encapsulation layer and connected to at least the electric connection structure and at least one of the second pads;

a heat dissipation electrode, located on the side of the front surface of the plastic encapsulation layer and connected to the thermal conductive adhesive.

2. The MCM package structure according to claim 1, wherein the thermal conductive adhesive is filled between the accommodating recess and the second die, and the thermal conductive adhesive contacts at least a portion of side walls of the accommodating recess, at least a portion of side walls of the second die, a bottom wall of the accommodating recess, and a bottom wall of the second die.

3. The MCM package structure according to claim 1, wherein the electric connection structure comprises an electric conductive column, an electric conductive plug, or an electric conductive layer located on an inner wall of a through hole.

4. The MCM package structure according to claim 1, wherein the first die comprises a first back electrode located on the back surface of the first die; the thermal conductive adhesive has an electric conductive function, and the heat dissipation electrode is configured to electrically connect to a constant potential.

5. The MCM package structure according to claim 4, wherein the second die comprises a second back electrode located on a back surface of the second die.

6. The MCM package structure according to claim 1, wherein the accommodating recess is in a stepped shape.

7. The MCM package structure according to claim 1, wherein the active surface of the first die is covered with a first protective layer, and the first protective layer comprises first openings that expose the first pads.

8. The MCM package structure according to claim 7, wherein the active surface of the second die is covered with a second protective layer, and the second protective layer comprises second openings that expose the second pads.

9. The MCM package structure according to claim 1, wherein the active surface of the second die, the thermal conductive adhesive, and the back surface of the first die are covered with a leveling layer, and an upper surface of the leveling layer is flush with the front surface of the plastic encapsulation layer.

10. The MCM package structure according to claim 1, wherein the second die comprises a second back electrode located on a back surface of the second die; the thermal conductive adhesive has an electric conductive function, and the heat dissipation electrode is configured to electrically connect to a constant potential.

11. The MCM package structure according to claim 1, wherein the active surface of the second die is covered with a second protective layer, and the second protective layer comprises second openings that expose the second pads.

12. A method of manufacturing an MCM package structure, comprising:

forming a plastic encapsulation intermediate body, wherein the plastic encapsulation intermediate body comprises:

a first die, comprising first pads located on an active surface of the first die, wherein the first die is provided with an accommodating recess, and an opening of the accommodating recess is located on a back surface of the first die;

a second die, comprising second pads located on an active surface of the second die, wherein the second die is arranged in the accommodating recess and fixed with the first die through a thermal conductive adhesive, and the active surface of the second die faces away from the active surface of the first die;

a plastic encapsulation layer, coating at least a side surface of the first die and comprising a front surface and a back surface facing oppositely, wherein the front surface of the plastic encapsulation layer and the active surface of the second die face toward a same direction, and the back surface of the plastic encapsulation layer and the active surface of the first die face toward a same direction;

forming one of a first electric conductive structure and a second electric conductive structure on the plastic encapsulation intermediate body, wherein the first electric conductive structure is located on a side of the back surface of the plastic encapsulation layer and connected to the first pads; the second electric conductive structure is located on a side of the front surface of the plastic encapsulation layer and connected to the second pads; forming a heat dissipation electrode while the second electric conductive structure is formed, and the heat dissipation electrode is connected to the thermal conductive adhesive;

forming a through hole in the plastic encapsulation layer, wherein a bottom wall of the through hole exposes the formed first electric conductive structure or second electric conductive structure;

forming another one of the first electric conductive structure and the second electric conductive structure on the plastic encapsulation intermediate body, and simultaneously forming an electric conductive layer on side walls and the bottom wall of the through hole and the plastic encapsulation layer outside the through hole, wherein the another one of the first electric conductive structure and the second electric conductive structure is connected to the electric conductive layer located on the plastic encapsulation layer outside the through hole.

13. The method of manufacturing an MCM package structure according to claim 12, wherein the plastic encapsulation intermediate body is formed by:

providing a carrier plate and at least one set of to-be-plastic-encapsulated parts carried on the carrier plate, wherein each set of to-be-plastic-encapsulated parts comprises: the first die and the second die, wherein the first die comprises the first pads located on the active surface of the first die, the first die is provided with the accommodating recess, and the opening of the accommodating recess is located on the back surface of the first die; the second die comprises the second pads located on the active surface of the second die, the second die is arranged in the accommodating recess and fixed with the first die through the thermal conductive adhesive, and the active surface of the second die faces away from the active surface of the first die, wherein the active surface of the first die faces toward the carrier plate;

forming the plastic encapsulation layer that embeds the to-be-plastic-encapsulated parts on a surface of the carrier plate, wherein the plastic encapsulation layer comprises the front surface and the back surface facing oppositely; thinning the plastic encapsulation layer from the front surface of the plastic encapsulation layer until the active surface of the second die is exposed; removing the carrier plate.

14. The method of manufacturing an MCM package structure according to claim 13, wherein each set of to-be-plastic-encapsulated parts is formed by:

providing the first die, and disposing a liquid or semi-solid thermal conductive adhesive in the accommodating recess;

providing the second die, wherein the active surface of the second die faces away from the active surface of the first die, and the second die is arranged in the accommodating recess; the liquid or semi-solid thermal conductive adhesive is filled between the accommodating recess and the second die, and the liquid or semi-solid thermal conductive adhesive contacts at least a portion of side walls of the accommodating recess, a bottom wall of the accommodating recess, a bottom wall of the second die, and at least a portion of side walls of the second die;

solidifying the liquid or semi-solid thermal conductive adhesive to fix the second die and the first die.

15. The method of manufacturing an MCM package structure according to claim 12, wherein the plastic encapsulation intermediate body is formed by:

providing a carrier plate and at least one set of to-be-plastic-encapsulated parts carried on the carrier plate, wherein each set of to-be-plastic-encapsulated parts comprises: the first die, the second die and a leveling layer, wherein the first die comprises the first pads located on the active surface of the first die, the first die is provided with the accommodating recess, and the opening of the accommodating recess is located on the back surface of the first die; the second die comprises the second pads located on the active surface of the second die, the second die is arranged in the accommodating recess and fixed with the first die through the thermal conductive adhesive, and the active surface of the second die faces away from the active surface of the first die; the leveling layer covers on the active surface of the second die, the thermal conductive adhesive, and the back surface of the first die, and the leveling layer faces toward the carrier plate;

forming the plastic encapsulation layer that embeds the to-be-plastic-encapsulated parts on a surface of the carrier plate, wherein the plastic encapsulation layer comprises the front surface and the back surface facing oppositely, and the front surface of the plastic encapsulation layer and the leveling layer face toward a same direction; thinning the plastic encapsulation layer from the back surface of the plastic encapsulation layer until the active surface of the first die is exposed; removing the carrier plate.

16. A method of manufacturing an MCM package structure, comprising:

forming a plastic encapsulation intermediate body, wherein the plastic encapsulation intermediate body comprises:

a first die comprising first pads located on an active surface of the first die, wherein the first die is provided with an accommodating recess, and an opening of the accommodating recess is located on a back surface of the first die;

a second die comprising second pads located on an active surface of the second die, wherein the second die is arranged in the accommodating recess and fixed with the first die through a thermal conductive adhesive, and the active surface of the second die faces away from the active surface of the first die;

a plastic encapsulation layer coating at least a side surface of the first die and comprising a front surface and a back surface facing oppositely, wherein the front surface of the plastic encapsulation layer and the active surface of the second die face toward a same direction, and the back surface of the plastic encapsulation layer and the active surface of the first die face toward a same direction;

forming one of a first electric conductive structure and a second electric conductive structure on the plastic encapsulation intermediate body, wherein the first electric conductive structure is located on a side of the back surface of the plastic encapsulation layer and connected to the first pads; the second electric conductive structure is located on a side of the front surface of the plastic encapsulation layer and connected to the second pads; forming a heat dissipation electrode while the second electric conductive structure is formed, and the heat dissipation electrode is connected to the thermal conductive adhesive;

forming an electric conductive plug or an electric conductive column in the plastic encapsulation layer, wherein the electric conductive plug comprises a first end and a second end being opposite to each other, and the first end of the electric conductive plug is connected to the formed first electric conductive structure or second electric conductive structure; the electric conductive column is coated by the plastic encapsulation layer, and comprises a first end and a second end being opposite to each other, the first end of the electric conductive column and the front surface of the plastic encapsulation layer face toward a same direction, and the second end of the electric conductive column and the back surface of the plastic encapsulation layer face toward a same direction;

forming another one of the first electric conductive structure and the second electric conductive structure on the plastic encapsulation intermediate body and the electric conductive plug or the electric conductive column-plug, wherein the electric conductive plug is connected to the first electric conductive structure and the second electric conductive structure;

forming the MCM package structure through cutting.

17. The method of manufacturing the MCM package structure according to claim 16, wherein the plastic encapsulation intermediate body is formed by:

providing a carrier plate and at least one set of to-be-plastic-encapsulated parts carried on the carrier plate, wherein each set of to-be-plastic-encapsulated parts comprises: the first die, the second die and the electric conductive column, wherein the first die comprises the first pads located on the active surface of the first die, the first die is provided with the accommodating recess, and the opening of the accommodating recess is located on the back surface of the first die; the second die comprises the second pads located on the active surface of the second die, the second die is arranged in the accommodating recess and fixed with the first die through the thermal conductive adhesive, and the active surface of the second die faces away from the active surface of the first die; the electric conductive column comprises the opposite first end and second end, and wherein the active surface of the first die and the first end of the electric conductive column face toward the carrier plate.

* * * * *